United States Patent
Knoll

(10) Patent No.: US 8,031,543 B2
(45) Date of Patent: Oct. 4, 2011

(54) MEMORY CHIP HAVING A COMPLEX TERMINATION

(75) Inventor: Bernhard Theo Knoll, Neubiberg (DE)

(73) Assignee: Qimonda AG, Munich (DE)

( * ) Notice: Subject to any disclaimer, the term of this patent is extended or adjusted under 35 U.S.C. 154(b) by 575 days.

(21) Appl. No.: 11/851,952

(22) Filed: Sep. 7, 2007

(65) Prior Publication Data
US 2008/0061819 A1    Mar. 13, 2008

(30) Foreign Application Priority Data
Sep. 8, 2006 (DE) .......................... 10 2006 042 335

(51) Int. Cl.
*G11C 7/00* (2006.01)

(52) U.S. Cl. ............. 365/198; 326/30; 365/51; 365/191

(58) Field of Classification Search .................. 326/30; 365/51, 149, 191, 198
See application file for complete search history.

(56) References Cited

U.S. PATENT DOCUMENTS

| | | | | |
|---|---|---|---|---|
| 6,084,425 | A * | 7/2000 | Liaw et al. | 326/30 |
| 6,992,501 | B2 * | 1/2006 | Rapport | 326/30 |
| 7,187,069 | B2 * | 3/2007 | Uematsu et al. | 257/685 |
| 7,457,589 | B2 * | 11/2008 | Kuzmenka | 455/67.16 |
| 7,542,305 | B2 * | 6/2009 | Petersen et al. | 361/785 |
| 2006/0056215 | A1 | 3/2006 | Petersen et al. | |
| 2006/0067141 | A1 | 3/2006 | Perego et al. | |

FOREIGN PATENT DOCUMENTS

| | | |
|---|---|---|
| CH | 435 376 | 5/1967 |
| EP | 1 587 112 | 10/2005 |

OTHER PUBLICATIONS

Youbok Lee, PH D., Antenna Circuit Design for RFID Applications, AN710, DSC00710C pp. 1-50, Microchip Technology Inc., 2003.

* cited by examiner

*Primary Examiner* — Alexander Sofocleous
(74) *Attorney, Agent, or Firm* — Patterson & Sheridan, LLP

(57) ABSTRACT

A memory chip has a signal line and a complex impedance which is connected to the signal line for termination of the signal line. A memory having such a memory chip and a method for operating a memory chip are also described. The memory chip on the memory having a signal line that is terminated with a complex impedance.

25 Claims, 3 Drawing Sheets

MEMORY CHIP HAVING A COMPLEX TERMINATION

CROSS-REFERENCE TO RELATED APPLICATIONS

This application claims foreign priority benefits under 35 U.S.C. §119 to co-pending German patent application number DE 10 2006 042 335.6, filed 8 Sep. 2006. This related patent application is herein incorporated by reference in its entirety.

BACKGROUND OF THE INVENTION

Modern computer systems typically include a processor and a memory device which stores information accessed by the processor. During system operation, the processor may issue access commands to the memory device to access the stored information. The access commands issued by the processor may include read and write commands. For each received access command, the memory device may process the received access command and use the access command to access a memory array which contains the information stored by the memory device.

SUMMARY OF THE INVENTION

Embodiments of the invention generally provide a memory component (e.g., a chip) comprising of a signal line and a plurality of complex impedances. The memory component is configured to selectively terminate the signal line with one or more of the plurality of complex impedances.

BRIEF DESCRIPTION OF THE DRAWINGS

Various features of embodiments will become clear from the following description, taken in conjunction with the accompanying drawings. It is to be noted, however, that the accompanying drawings illustrate only typical embodiments and are, therefore, not to be considered limiting of the scope of the invention. The present invention may admit other equally effective embodiments.

DETAILED DESCRIPTION OF THE PREFERRED EMBODIMENT

Figure 1:
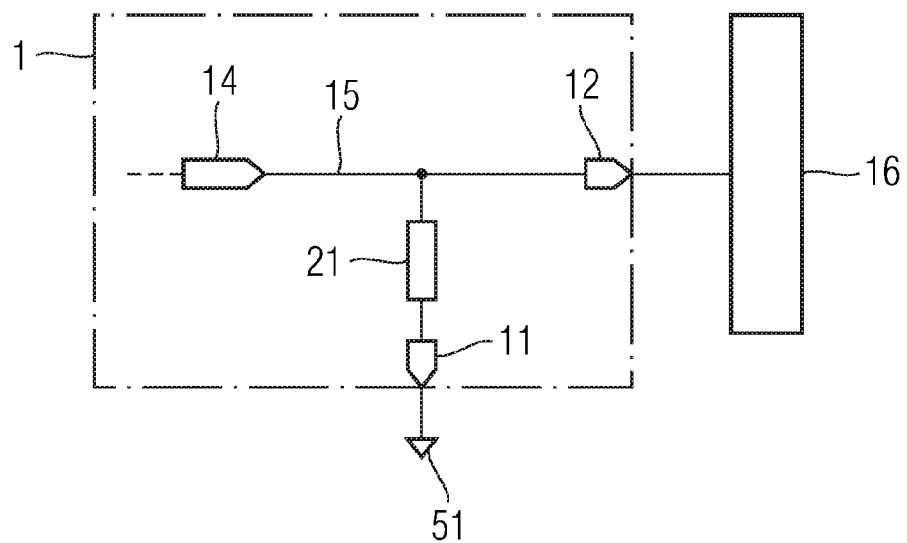
FIGS. 1 to 5 show schematic illustrations of a memory having a memory chip according to different embodiments.

The embodiments described below relate to a memory chip having a terminated signal line, to a memory having such a memory chip, and to a method for operating a memory chip.

In order to improve signal transmission in memory chips, for example DRAMs (Dynamic Random Access Memories), internal signal lines of the memory chips may be terminated. In the case of this termination technique which is referred to as "on die termination" (ODT), the memory chips have, in an input or output region, additional ohmic resistors which electrically contact-connect the signal lines. During operation of the memory chips, the termination resistors are connected to a fixed reference potential, for example a ground potential. This suppresses signal reflections which interfere with data transmission, which occur, in principle, at impedance changes along the signal propagation direction when transmitting radio-frequency signals and, in the extreme case, are superimposed on the useful signals in such a manner that information transmitted or received by the memory chips becomes unrecognizable.

However, on account of the continuous increase in the signal transmission rates and thus in the frequencies of the signals transmitted on the signal lines, said increase being required in the semiconductor industry, inductive and capacitive impedance components are becoming increasingly dominant. Internal and external signal lines, for example, are the cause of such parasitic impedances. Therefore, despite the use of termination resistors, signal reflections may increasingly occur as the transmission rates and frequencies of the transmitted signals increase, said signal reflections impairing signal transmission.

The embodiments below relate to the termination of a signal line with the aid of a complex impedance.

One embodiment proposes a memory chip having a signal line and having a complex impedance which is electrically connected to the signal line for termination of the signal line. Incorporating such a complex-value component for the purpose of terminating the signal line makes it possible to effectively match the impedance of the memory chip to the electrical surroundings of the memory chip. For example, the input or output structures within the memory chip can be effectively matched to external signal lines and electrical structures outside the memory chip. This makes it possible to avoid or suppress the signal reflections, which occur at impedance changes in the transmission path, with a high level of reliability even at high signal frequencies. Therefore, the memory chip may enable reliable signal transmission at a high transmission rate.

In addition, it may be possible for the impedance matching of the memory chip to be resonant. In this case, the resonant circuit behavior of the memory chip, which may be influenced on the basis of the complex impedance, is used to achieve resonance amplification for signals at a predefined signal frequency (resonant frequency).

According to another embodiment, the memory chip has a switching device which is assigned to the complex impedance. This makes it possible to configure the termination of the signal line and the impedance matching of the memory chip in a flexible manner. This involves, for example, matching the input/output impedance of the memory chip to different signal transmission requirements, for example different frequency bandwidths of the signals which are transmitted via the signal line.

According to another embodiment, it is possible to effectively match the impedance of the memory chip by arranging a further complex impedance in the signal line of the memory chip.

According to another embodiment, the complex impedance may have an inductance. In this case, the inductance may be formed by one or more coils, for example.

According to another embodiment, the complex impedance may have a capacitance. In this case, the capacitance may be formed by one or more capacitors, for example.

In another embodiment, the complex impedance may additionally have an ohmic resistor. This makes it possible, for example, to define the quality factor of the memory chip, which acts as an electrical resonant circuit, and thus to define the frequency bandwidth which may be transmitted.

According to another embodiment, the signal line may electrically connect a connection and an input/output switching element of the memory chip to one another. In this case, the termination of the signal line with the aid of the complex impedance may be effected in an input/output region of the memory chip, in which corresponding input or output structures of the memory chip may be susceptible to signal reflections.

One embodiment furthermore proposes a memory having a memory chip according to one of the embodiments described above, the complex impedance of the memory chip being connected to a reference potential. On account of the use of the complex-value impedance to terminate the signal line, it is possible to effectively match the impedance of the memory chip in the memory. Consequently, signals may be reliably transmitted both into the memory chip and out of the memory chip at a high transmission rate.

According to another embodiment, the memory has a switching device which is assigned to the complex impedance of the memory chip. This makes it possible to configure the termination of the signal line and the impedance matching of the memory chip in a flexible manner. In particular, the termination of the signal line may be precisely matched to the electrical properties of the memory chip which influence signal transmission.

One embodiment also proposes a method for operating a memory chip, a signal line of the memory chip being terminated with a complex impedance for the purpose of impedance matching. In a corresponding manner, by incorporating a complex-value impedance, the method makes it possible to effectively match the impedance of the memory chip and thus enables reliable signal transmission, in particular at a high transmission rate.

In another embodiment of the method, the impedance matching of the memory chip may be resonant. In this case, signals which are transmitted via the signal line and are at a signal frequency corresponding to the resonant condition (resonant frequency) may be caused to be optimized or amplified.

In another embodiment, the signal line of the memory chip may be terminated with a complex impedance from a number of complex impedances. This may enable high flexibility of the method.

Further embodiments relating to the termination of a signal line are explained in connection with the figures.

In the case of a memory chip of a memory, for example a MOS (Metal Oxide Semiconductor) memory chip such as a DRAM or else a flash memory chip, a signal line of the memory chip may be terminated with a complex impedance. This termination concept, which may be applied to any kind of memory chip, makes it possible to effectively match the impedance of the memory chip, for example input/output structures of the memory chip, to its electrical surroundings. In this case, the electrical surroundings of the memory chip may comprise external signal lines, for example bonding wires and line structures of a printed circuit board (PCB), and, if appropriate, further electrical structures and circuit elements outside the memory chip.

This configuration makes it possible to avoid or largely suppress interfering signal reflections, which occur along the signal propagation direction at impedance changes, for example a terminal or connection of the memory chip, with a high level of reliability even at high frequencies of the transmitted signals. Consequently, signals may be reliably transmitted both into the memory chip and out of the memory chip at high transmission rates.

FIG. 1 shows a schematic illustration of a memory having a memory chip 1 according to one embodiment. The memory chip 1 has an input/output switching element 14 which is in the form of a switching transistor or field effect transistor (FET), for example, in an input/output region. Further structures of the memory chip 1, for example a logic circuit and a memory cell array, which are not illustrated for reasons of clarity, adjoin the input/output switching element 14.

The input/output switching element 14 is electrically connected to a connection 12 of the memory chip 1 by means of a signal line 15. The memory chip 1 is connected to a control device 16 of the memory by means of the connection 12 and further external signal lines. Radio-frequency signals generated by the control device 16 may be supplied to the memory chip 1 and signals from the memory chip 1 may be transmitted to the control device 16 in this manner. These signals may be, for example, address signals and data signals at a signal frequency of 1 GHz, for example. Moreover, the signals may have other signal frequencies.

The memory chip 1 has a complex impedance 21 which is electrically connected to the signal line 15 and is intended to terminate the signal line 15. For this purpose, the impedance 21 is connected to a fixed reference potential 51 by means of a further connection 11 of the memory chip 1. In this case, the reference potential 51 may be a ground potential, for example. Alternatively, the reference potential 51 may also be a supply voltage for the memory.

Figure 2:
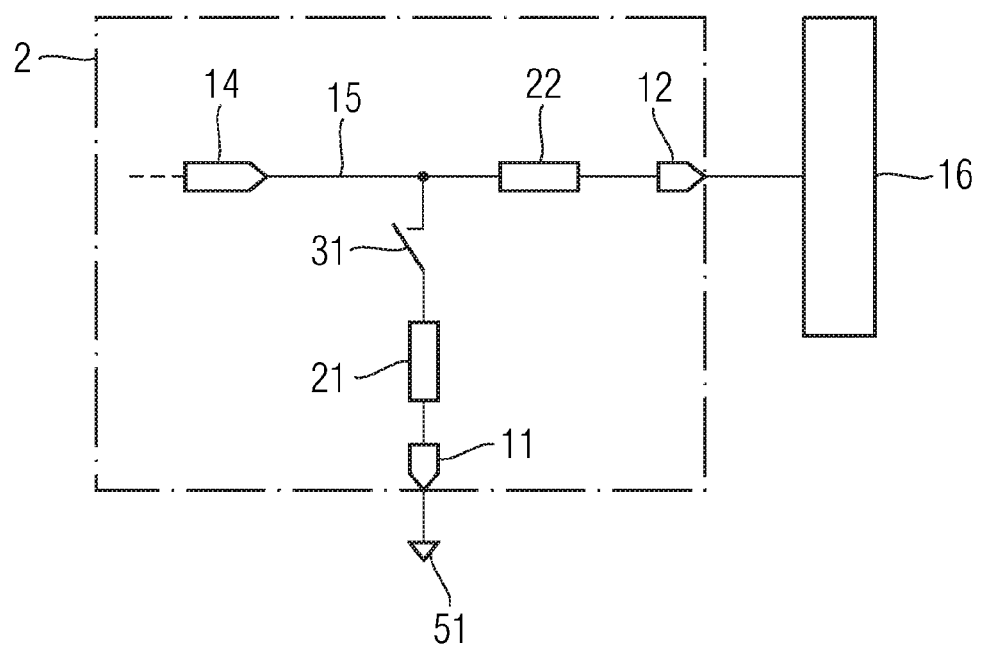

FIG. 2 shows another embodiment of a memory chip 2. In contrast to the memory chip 1 of FIG. 1, the memory chip 2 has a switching device 31 which is assigned to the impedance 21 and is provided for activating and deactivating the termination of the signal line 15 in a flexible manner. In this case, the switching device 31 which may be in the form of a switching transistor, for example, may be controlled by the control device 16 of the memory, for example. In addition, the memory chip 2 additionally has a further complex impedance 22 which is arranged in the signal line 15.

The complex impedance 21 for terminating the signal line 15 of the memory chips 1, 2 may have an inductance or inductances and/or a capacitance or capacitances and, if appropriate, additionally one or more ohmic resistors. This correspondingly applies to the impedance 22 of the memory chip 2 that is arranged in series in the signal line 15. In this case, an inductance may be formed by a coil, for example. A capacitance may be formed, for example, by a capacitor, for example a trench capacitor.

These circuit elements may be connected to one another in any desired arrangements, for example series or parallel circuits, in an impedance 21, 22. In this case, the exact composition and dimensioning of an impedance 21, 22 for achieving optimum signal transmission may be dependent, in particular, on the electrical surroundings, that is to say on the specific application of a memory chip, and may be determined, for example, by means of a system simulation and/or a measurement.

When matching the impedance of a memory chip, the resonant frequency of the memory chip which acts as an electrical resonant circuit may be matched to the frequency or frequencies of the signals to be transmitted in order to achieve optimum signal transmission. In addition, the resonant circuit behavior of a memory chip, which may be influenced on the basis of the complex impedance(s) 21, 22, may be used to design the impedance matching to be resonant. In this case, signals at a signal frequency that corresponds to the resonant frequency are caused to be subjected to resonance amplification.

Figure 3:
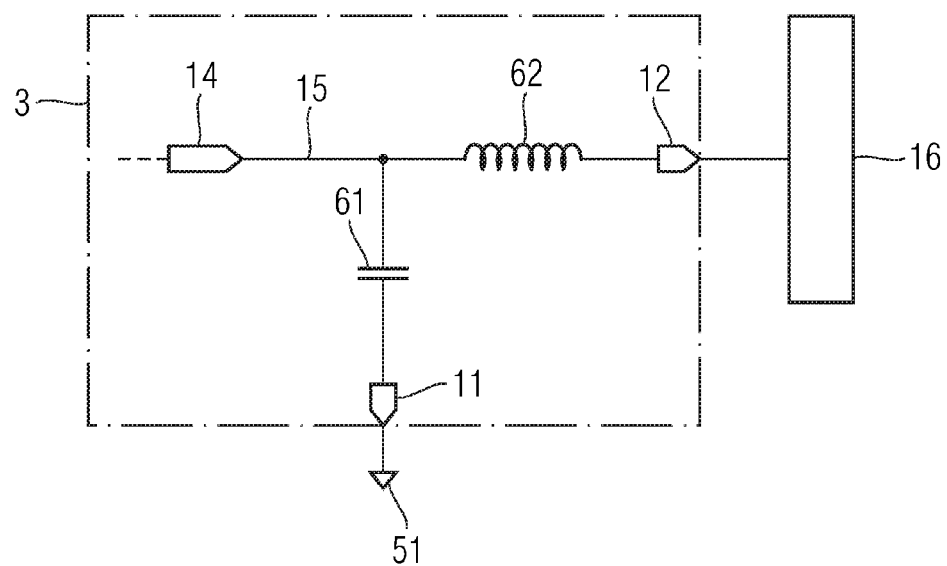

For the purpose of exemplary illustration, FIG. 3 shows another embodiment of a memory chip 3, which may be used to achieve resonance amplification of signals in a relatively simple manner. The memory chip 3 has a capacitor 61 which is connected to the signal line 15 for termination of the signal line 15, and has the reference potential 51 applied to it by means of the connection 11. In addition, a coil 62 which is arranged in series in the signal line 15 is provided. The capacitor 61 and the coil 62 together form a series resonant circuit, with the result that a signal which is transmitted at the resonant frequency of this series resonant circuit is amplified.

During resonant impedance matching, it may be taken into account that, at a given resonant frequency $f_{res}$ the possible frequency bandwidth B in accordance with $$B = f_{res}/Q \tag{1}$$

is inversely proportional to the quality factor Q of the corresponding resonant circuit. The quality factor Q is also inversely proportional to the ohmic resistance of the resonant circuit, that is to say the lower the ohmic resistance selected, the higher the quality factor Q and thus the resonance amplification.

Resonance amplification for signals at the resonant frequency $f_{res}$ around the quality factor Q results, in accordance with formula (1), in a reduction in the bandwidth B which may be transmitted. Depending on the application of the memory chip in question, that is to say depending on predefined frequencies of the signals which are transmitted via the signal line 15, for example, it may therefore be preferred to limit the resonance amplification in favor of the bandwidth B.

Figure 4:
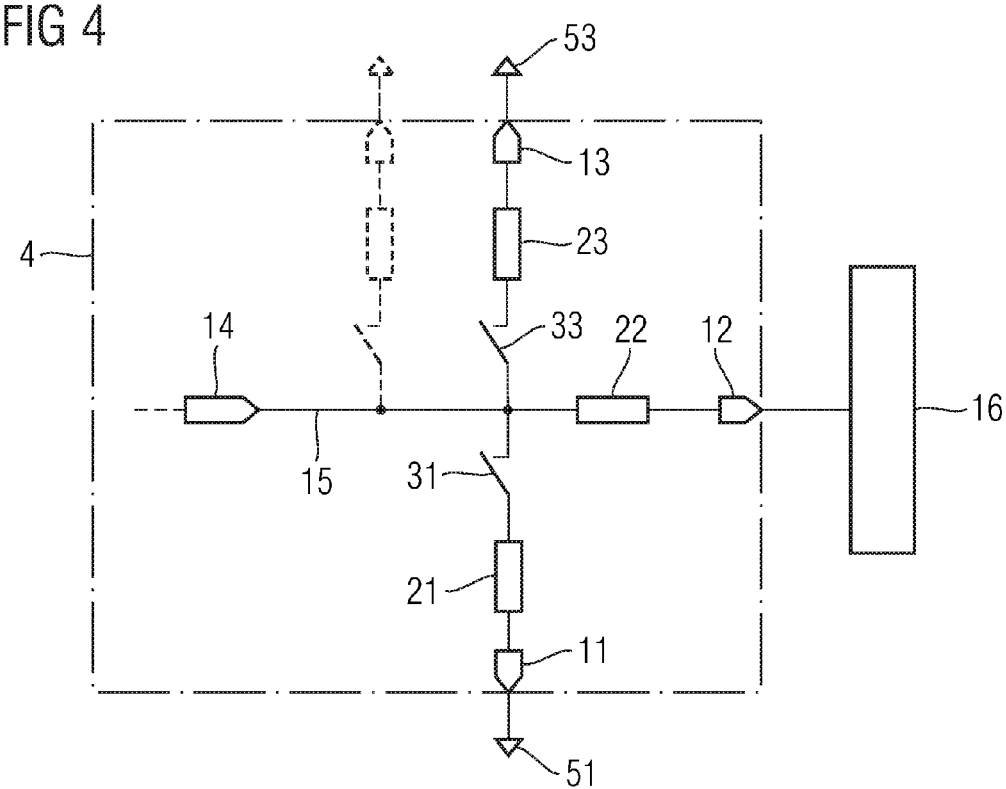

In order to achieve high flexibility when matching the impedance of a memory chip, it is proposed to terminate the signal line 15, in a manner such that it may be switched, with a complex impedance from a number of complex impedances. In this respect, FIG. 4 shows a memory having a memory chip 4 according to another embodiment. The memory chip 4 has at least two complex impedances 21, 23 which are connected to the signal line 15 by means of corresponding switching devices 31, 33 for termination of the signal line 15 and are connected to fixed reference potentials 51, 53 by means of corresponding connections 11, 13 of the memory chip 4. In addition, the memory chip 4 also has a further impedance 22 which is arranged in the signal line 15. The statements above may correspondingly apply to the design of the impedances 21, 22, 23 and the specific design of resonance amplification.

The switching devices 31, 33 make it possible to terminate the signal line 15 of the memory chip 4 in a flexible manner, for example depending on frequency properties of the signals which are transmitted via the signal line 15 and depending on electrical properties of the memory chip 4, with one of the two impedances 21, 23 and, if appropriate, with both impedances 21, 23 together. The switching devices 31, 33 may in turn be in the form of switching transistors and may be activated, for example, using the control device 16 of the memory.

Both reference potentials 51, 53 may be a ground potential or a supply voltage for the memory. It is also possible for the reference potentials 51, 53 to be different potentials, with the result that the reference potential 51 may be a ground potential, for example, and the reference potential 53 may be a supply voltage for the memory.

Instead of providing only two impedances 21, 23 for termination of the signal line 15 which may be activated using switching devices 31, 33, the memory chip 4 may have further impedances which may be switched and are connected to the signal line 15, as indicated in FIG. 4. Furthermore, it is possible to additionally provide impedances which are connected to the signal line 15 for permanent termination of the signal line 15, without providing associated switching devices (not illustrated in FIG. 4).

Figure 5:
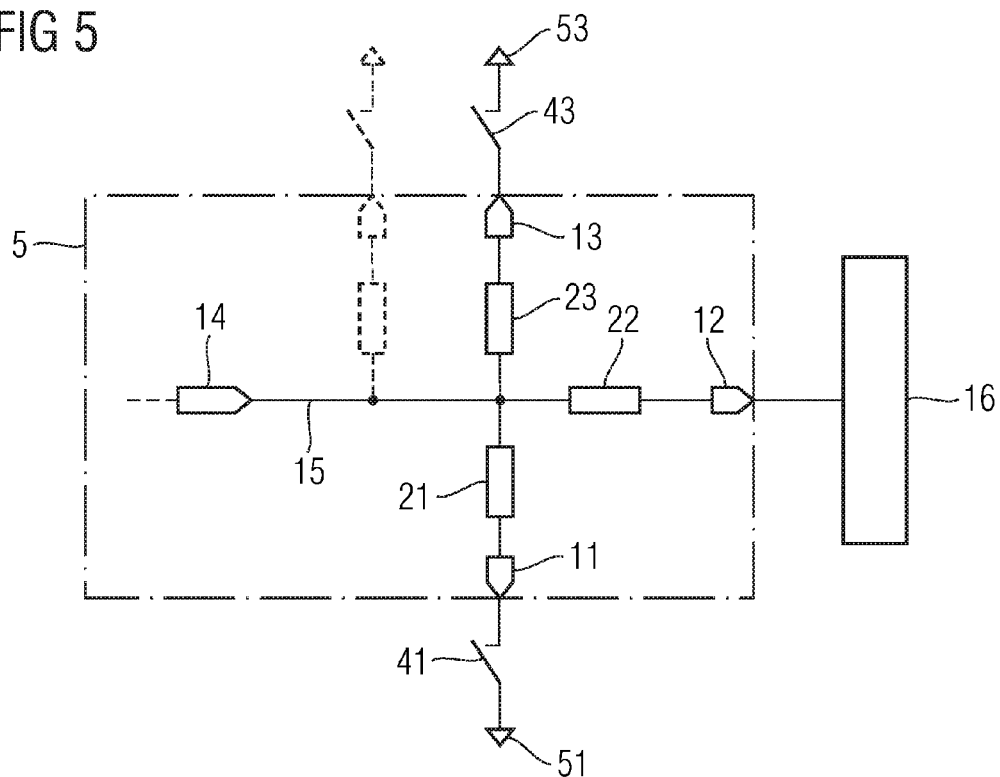

FIG. 5 shows a memory having a memory chip 5 according to another embodiment, which likewise has two complex impedances 21, 23 for terminating the signal line 15 as well as a further complex impedance 22 which is arranged in the signal line 15. In order to activate and deactivate the termination of the signal line 15 in a flexible manner using the impedances 21, 23, provision is made of two switching devices 41, 43 which are, however, arranged outside the memory chip 5 in the memory.

Instead of providing only two impedances 21, 23 for termination of the signal line 15 which may be activated using switching devices 41, 43, the memory chip 5 may have further impedances which may be switched and are connected to the signal line 15, as indicated in FIG. 5. Furthermore, it is possible to provide further impedances which are connected to the signal line 15 for permanent termination of the signal line 15, without providing corresponding switching devices (not illustrated in FIG. 5).

The switching devices 41, 43 illustrated may also be in the form of switching transistors which may be activated using the control device 16 of the memory. Alternatively, it is possible for the switching devices 41, 43 to be in the form of fuses in order to permanently define a possible termination of the signal line 15 using one of the impedances 21, 23, for example. The termination of the signal line 15 may, for example, be defined on the basis of a functional test which is carried out after the memory chip 5 has been produced. In this manner, the impedance matching of the memory chip 5 may depend, for example, on the electrical properties of the memory chip 5 which are determined in the test and on the frequency properties of the signals to be transmitted via the signal line 15.

Figure 6:
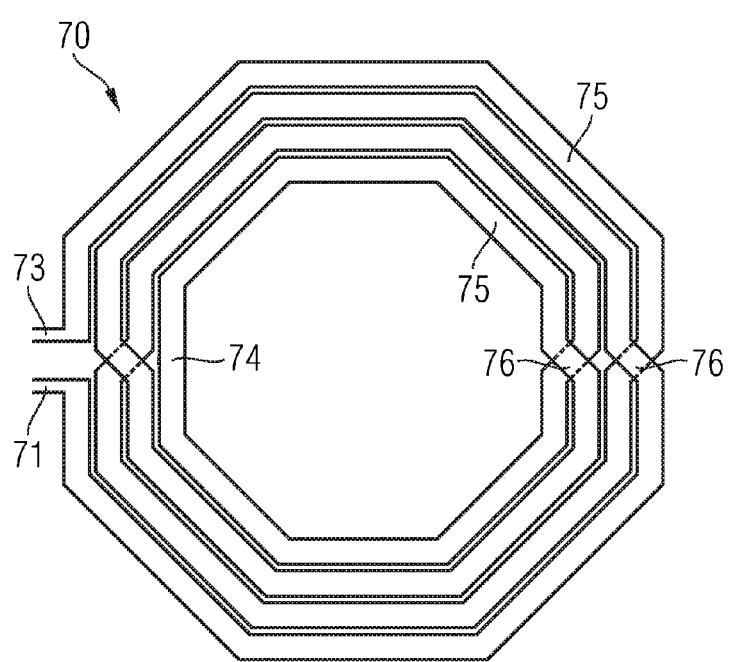
FIG. 6 shows a schematic plan view of one exemplary embodiment of a coil which may be used to terminate a signal line of a memory chip.

FIG. 6 shows a schematic plan view of one exemplary embodiment of a coil 70 which may be used to terminate a signal line of a memory chip. The coil 70 has a symmetrical design with four octagonal coil turns 75 and two connections 71, 73 which are arranged on a first plane of the memory chip in question. In addition, connecting elements 76 for connecting the individual coil turns 75 are provided. In this case, a portion of the connecting elements 76 is arranged on a second plane that is parallel to the first plane, for example under the first plane, as illustrated in FIG. 6 by the dashed lines.

The coil 70 may be used in all of the memory chips 1 to 5 illustrated in FIGS. 1 to 5 in order to form an inductance. For an exemplary capacitance of a signal line 15 of C=3 pF and an exemplary signal transmission rate of $f_{res}$=1 GHz, an inductance of L=8.4 nH results for the coil 70 (which may be used, for example, as an impedance 21 in the memory chip 1 illustrated in FIG. 1) in accordance with $$f_{res}^2 = 1/(4\pi^2 LC) \tag{2}.$$

In the case of the coil 70 having N=4 coil turns 75, such an inductance L may be realized with an external diameter $2*r_0$ of approximately 500 µm in accordance with $$r_0[\mu m] = 500 L[nH]/N^2 \tag{3},$$

where $r_0$ represents an external radius. In contrast, for a coil having a geometry that corresponds to that of the coil 70 and having a number of N=8 coil turns, an external diameter of approximately 130 µm results. The preceding specifications are only considered as examples and may be replaced by other specifications.

On account of the symmetrical design of the coil 70 illustrated in FIG. 6, a center tap 74 may be enabled in a simple manner. This makes it possible for the coil 70 to be used, for example in the memory chip 4 illustrated in FIG. 4, in such a manner that the connections 71, 73 of the coil 70 are brought to the reference potentials 51, 53 and the center tap 74 is connected to the signal line 15 or to the input/output switching element 14.

The embodiments of a memory and a memory chip which have been explained using the figures are exemplary embodiments. Alternative embodiments which represent further modifications or combinations of the memories and memory chips illustrated are also conceivable.

For example, it is possible to configure the memory chips 2, 4, 5 illustrated in FIGS. 2, 4 and 5 without an impedance 22 being arranged in the signal line 15. It is also possible to modify the embodiment illustrated in FIG. 2 in such a manner that, instead of the switching device 31 for activating the termination of the signal line 15, a switching device is arranged outside the memory chip 2.

Furthermore, in the case of the memory chips 2 and 4 illustrated in FIGS. 2 and 4, the switching devices 31, 33 may be provided between the complex impedances 21, 23 and the corresponding connections 11, 13 of the memory chips 2 and 4 instead of arranging the switching devices 31, 33 between the signal line 15 and the corresponding impedances 21, 23. It is also possible for the switching devices 31, 33 to be in the form of fuses.

Embodiments of a memory which comprise combinations of the memories illustrated in FIGS. 4 and 5 are also conceivable. Such embodiments may have switching devices, which are associated with the impedances used for termination, both inside and outside a memory chip.

Furthermore, the coil 70 depicted in FIG. 6 is only one exemplary embodiment of a coil which may be used to terminate a signal line in a memory chip. Alternative embodiments of a coil which are in the form of a spiral, for example, and/or have a round shape may be used to terminate a signal line of a memory chip.

The preceding description describes exemplary embodiments of the invention. The features disclosed therein and the claims and the drawings can, therefore, be useful for realizing various embodiments of the invention, both individually and in any combination. While the foregoing is directed to embodiments of the invention, other and further embodiments of this invention may be devised without departing from the basic scope of the invention, the scope of the present invention being determined by the claims that follow.

What is claimed is:

1. A memory chip, comprising:
   a signal line;
   a plurality of complex impedances connected to the signal line; and
   a plurality of switching devices, wherein each switching device of the plurality of switching devices is connected to a respective complex impedance of the plurality of complex impedances to provide a selective termination of the signal line with one or more of the plurality of complex impedances.

2. The memory chip as claimed in claim 1, wherein each switching device of the plurality of switching devices is arranged in series with its respective complex impedance of the plurality of complex impedances.

3. The memory chip as claimed in claim 1, wherein each switching device of the plurality of switching devices is in the form of a switching transistor or a fuse.

4. The memory chip as claimed in claim 1, further comprising a further complex impedance which is arranged in series in the signal line.

5. The memory chip as claimed in claim 1, wherein a further complex impedance, which may be one of the plurality of complex impedances or another complex impedance, is arranged in series in the signal line and has an inductance.

6. The memory chip as claimed in claim 5, wherein the inductance is formed by a coil.

7. The memory chip as claimed in claim 6, wherein the coil comprises coil turns and connecting elements, wherein the coil turns are arranged on a first plane and a portion of the connecting elements are arranged on a second plane that is parallel to the first plane.

8. The memory chip as claimed in claim 1, wherein a further complex impedance, which may be one of the plurality of complex impedances or another complex impedance, is arranged in series in the signal line and has a capacitance.

9. The memory chip as claimed in claim 8, wherein the capacitance is formed by a capacitor.

10. The memory chip as claimed in claim 9, wherein the capacitor is a trench capacitor.

11. The memory chip as claimed in claim 1, wherein the one or more of the plurality of complex impedances have an ohmic resistor.

12. The memory chip as claimed in claim 1, wherein the signal line electrically connects an input/output switching element of the memory chip to a connection.

13. The memory chip as claimed in claim 1, wherein signals which are transmitted via the signal line are subjected to resonance amplification.

14. The memory chip as claimed in claim 1, wherein the complex impedances which are connected to the signal line are connected to corresponding connections of the memory chip.

15. A memory device, comprising
   a memory chip, comprising:
      a signal line;
      a plurality of complex impedances which are connected to the signal line for termination of the signal line; and
      a plurality of switching elements, each switching element connected to a respective complex impedance to provide a selective termination of the signal line with one or more of the plurality of complex impedances; and
      wherein a complex impedance of the memory chip which is connected to the signal line is connected to a reference potential.

16. The memory device as claimed in claim 15, wherein the reference potential is a ground potential.

17. The memory device as claimed in claim 15, wherein the reference potential is a supply voltage for the memory device.

18. The memory device as claimed in claim 15, wherein a switching device of the plurality of switching devices is arranged outside the memory chip.

19. The memory device as claimed in claim 15, wherein a first complex impedance of the memory chip which is connected to the signal line is connected to a first reference potential and a second complex impedance of the memory chip which is connected to the signal line is connected to a second reference potential, the second reference potential being a different potential than the first reference potential use.

20. A method comprising:
   operating a memory chip, wherein a signal line of the memory chip is connected to a plurality of complex impedances, such that the signal line can be selectively terminated with one or more of the plurality of complex impedances and the complex impedances are configured for impedance matching of the memory chip;
   connecting a first complex impedance of the plurality of complex impedances to a first reference potential; and
   connecting a second complex impedance of the plurality of complex impedances to a second reference potential, wherein the second reference potential is a different potential than the first reference potential.

21. The method as claimed in claim 20, wherein the impedance matching is resonant in order to cause signals which are transmitted via the signal line to be subjected to resonance amplification.

22. A memory chip, comprising:
   a signal line; and
   a complex impedance which is connected to the signal line for termination of the signal line, wherein the complex impedance is matched in such a manner that signals which are transmitted via the signal line are caused to be subjected to resonance amplification.

23. The memory chip as claimed in claim 22, further comprising a further complex impedance which is arranged in series in the signal line, wherein the complex impedance which is connected to the signal line and the further complex impedance which is arranged in series in the signal line are matched in such a manner that signals which are transmitted via the signal line are caused to be subjected to resonance amplification.

24. The memory chip as claimed in claim 23, wherein the complex impedance which is connected to the signal line further comprises a capacitor.

25. The memory chip as claimed in claim 24, wherein the further complex impedance which is arranged in series in the signal line comprises a coil.

* * * * *